US010522684B2

(12) United States Patent
He

(10) Patent No.: US 10,522,684 B2
(45) Date of Patent: Dec. 31, 2019

(54) SEMICONDUCTOR STRUCTURE, MANUFACTURING METHOD THEREFOR, AND HIGH-K METAL GATE FIN FIELD-EFFECT TRANSISTOR

(71) Applicants: Semiconductor Manufacturing International (Shanghai) Corporation, Shanghai (CN); Semiconductor Manufacturing International (Beijing) Corporation, Beijing (CN)

(72) Inventor: Xin He, Shanghai (CN)

(73) Assignees: Semiconductor Manufacturing International (Shanghai) Corp., Shanghai (CN); Semiconductor Manufacturing International (Beijing) Corp., Beijing (CN)

( * ) Notice: Subject to any disclaimer, the term of this patent is extended or adjusted under 35 U.S.C. 154(b) by 0 days.

(21) Appl. No.: 16/039,085

(22) Filed: Jul. 18, 2018

(65) Prior Publication Data

US 2019/0035924 A1 Jan. 31, 2019

(30) Foreign Application Priority Data

Jul. 27, 2017 (CN) .......................... 2017 1 0621512

(51) Int. Cl.
*H01L 29/78* (2006.01)
*H01L 21/8238* (2006.01)
*H01L 29/66* (2006.01)
*H01L 21/02* (2006.01)
*H01L 21/768* (2006.01)

(52) U.S. Cl.
CPC ...... *H01L 29/785* (2013.01); *H01L 21/02614* (2013.01); *H01L 21/76829* (2013.01); *H01L 21/823842* (2013.01); *H01L 21/823821* (2013.01); *H01L 29/66795* (2013.01)

(58) Field of Classification Search
CPC ............. H01L 27/101; H01L 27/11206; H01L 21/823475
USPC .......................................... 257/530, E23.147
See application file for complete search history.

(56) References Cited

U.S. PATENT DOCUMENTS

| 2013/0187236 A1* | 7/2013 | Xie ...................... H01L 29/4966 257/369 |
| 2017/0154890 A1* | 6/2017 | Jin ...................... H01L 27/11206 |
| 2017/0200720 A1* | 7/2017 | Bao ........................ H01L 27/092 |

* cited by examiner

*Primary Examiner* — Jonathan Han
(74) *Attorney, Agent, or Firm* — Brinks Gilson & Lione

(57) ABSTRACT

This disclosure relates to a semiconductor structure for, e.g., a high-k metal gate fin field-effect transistor, and a manufacturing method therefor. The method may include providing a substrate structure including a first portion for forming a first PMOS device and a second portion for forming a second PMOS device; forming a first P-type work function adjustment layer on the substrate structure; forming a protective layer on the first P-type work function adjustment layer; patterning the protective layer to expose the first P-type work function adjustment layer on the first portion; oxidizing the exposed first P-type work function adjustment layer on the first portion; removing the protective layer; and forming a second P-type work function adjustment layer on the first P-type work function adjustment layer. Because the first P-type work function adjustment layer on the first portion is oxidized, gate voltage thresholds of the first portion and the second portion are different even when the thicknesses of metal layers on the first portion and the second portion are the same.

8 Claims, 11 Drawing Sheets

US 10,522,684 B2

SEMICONDUCTOR STRUCTURE, MANUFACTURING METHOD THEREFOR, AND HIGH-K METAL GATE FIN FIELD-EFFECT TRANSISTOR

RELATED DISCLOSURES

The present disclosure claims priority to Chinese Patent Application No. 201710621512.3, filed on Jul. 27, 2017, the entire disclosure of which is hereby incorporated by reference.

TECHNICAL FIELD

The present application relates to the field of semiconductor devices and fabrication, and in particular, to a semiconductor structure and a manufacturing method therefor for, e.g., high-k metal gate fin field-effect transistors.

BACKGROUND

A high-k metal gate fin field-effect transistor (HKMG FinFET), as shown in FIG. 1, may include a covering layer 110, a P-type work function metal layer 120, an N-type work function metal layer 130, and a barrier layer 140. A gate voltage threshold may be adjusted by adjusting a work function of a metal gate, thereby achieving multiple voltage threshold values.

Usually, the work function of the metal gate may be adjusted by changing the thickness of the metal gate, for example, by adjusting the thicknesses of titanium nitride, tantalum nitride, titanium aluminum carbide, or a compound thereof. For the HKMG FinFET, as the length of the gate is shortened, the space available for changing the thickness of a metal layer is limited, especially for a P-type low-threshold device. Therefore, new optimization solutions are desirable for a metal gate FinFET.

SUMMARY

A technical problem to be resolved by this application is to provide a semiconductor structure, a manufacturing method therefor, and high-k metal gate fin field-effect transistors based on the semiconductor structure, so as to implement multiple gate voltage thresholds for devices even when the thicknesses of metal layers are the same.

In some implementations, a method for manufacturing a semiconductor structure is provided. The method may include providing a substrate structure including a first portion for forming a first PMOS device and a second portion for forming a second PMOS device; forming a first P-type work function adjustment layer on the substrate structure; forming a protective layer on the first P-type work function adjustment layer; patterning the protective layer to expose the first P-type work function adjustment layer on the first portion; oxidizing the exposed first P-type work function adjustment layer on the first portion; removing the protective layer; and forming a second P-type work function adjustment layer on the first P-type work function adjustment layer.

In some implementations, the substrate structure above may further include a third portion for forming a first NMOS device and a fourth portion for forming a second NMOS device. Third portion and the fourth portion may be covered sequentially by the same first P-type work function adjustment layer and the same second P-type work function adjustment layer as the first portion. The manufacturing method may further include removing the second P-type work function adjustment layer on the third portion; forming a third P-type work function adjustment layer on the second P-type work function adjustment layer over the first portion, second portion, and fourth portion, and on the first P-type work function adjustment layer that is on the third portion; and removing the second P-type work function adjustment layer and the third P-type work function adjustment layer from the fourth portion.

In some implementations, the manufacturing method above may further include forming an N-type work function adjustment layer on the third P-type work function adjustment layer of the first portion, the second portion, and the third portion, and on the first P-type work function adjustment layer of the fourth portion.

In some implementations, the manufacturing method above may further include forming a barrier layer on the N-type work function adjustment layer.

In some implementations, the method above may further include performing an annealing processing before patterning the protective layer.

In some implementations, the substrate structure above may include an interface layer on a substrate and a high-dielectric-constant material layer on the interface layer.

In some implementations, the first P-type work function adjustment layer, the second P-type work function adjustment layer, and the third P-type work function adjustment layer above may each comprise one or more of Ta, TiN, TaN, TaSiN, and TiSiN. The protective layer above may comprise at least one of amorphous silicon, polysilicon, silicon nitride, or silicon oxide.

In some implementations, the N-type work function adjustment layer above may comprise one or more of TiAl, TiAlC, TaAlN, TiAlN, TaCN, and AlN.

In some other implementations, a semiconductor structure is further provided. The semiconductor structure may include a substrate structure having a high-dielectric-constant material layer and including a first portion for forming a first PMOS device and a second portion for forming a second PMOS device. The semiconductor structure may further include a first P-type work function adjustment layer disposed on the high-dielectric-constant material layer of the first portion and a first P-type work function adjustment layer disposed on the high-dielectric-constant material layer of the second portion. An oxygen vacancy concentration at an interface of the high-dielectric-constant material layer and the first P-type work function adjustment layer of the first portion is higher than an oxygen vacancy concentration at an interface of the high-dielectric-constant material layer and the first P-type work function adjustment layer of the second portion. The semiconductor structure may further include a second P-type work function adjustment layer disposed on the first P-type work function adjustment layer of the first portion and disposed on the first P-type work function adjustment layer of the second portion.

In some implementations, the substrate structure above may further include a third portion for forming a first NMOS device and a fourth portion for forming a second NMOS device. The semiconductor structure above may further include the first P-type work function adjustment layer disposed on the third portion and the fourth portion; and a third P-type work function adjustment layer disposed on the second P-type work function adjustment layer of the first portion and the second portion, and disposed on the first P-type work function adjustment layer of the third portion.

In some implementations above, the semiconductor structure may further include an N-type work function adjustment layer disposed on the third P-type work function adjustment layer of the first portion, second portion, and the third portion, and an N-type work function adjustment layer disposed on the first P-type work function adjustment layer of the fourth portion.

In some implementations, the semiconductor structure above may further include a barrier layer disposed on the N-type work function adjustment layer of all portions.

In some implementations, the substrate structure above may include a substrate, an interface layer on the substrate, and the high-dielectric-constant material layer on the interface layer.

In some implementations, the first P-type work function adjustment layer of the first portion, and the first P-type work function adjustment layer, the second P-type work function adjustment layer, and the third P-type work function adjustment layer of the second portion may include one or more of Ta, TiN, TaN, TaSiN, and TiSiN.

In some implementations, the N-type work function adjustment layer may include one or more of TiAl, TiAlC, TaAlN, TiAlN, TaCN, and AlN.

In some other implementations, a high-k metal gate fin field-effect transistor is further provided. The high-k metal gate fin field-effect transistor may include any of the semiconductor structure above.

In the implementations above, because the first P-type work function adjustment layer of the first portion is oxidized, the oxygen vacancy concentration at the interface of the high-dielectric-constant material layer and the first P-type work function adjustment layer of the first portion is higher than the oxygen vacancy concentration at the interface of the high-dielectric-constant material layer and the first P-type work function adjustment layer of the second portion. Therefore, voltage thresholds of the first portion and the second portion are different even when the thicknesses of metal layers on the first portion and the second portion are the same.

Other features and advantages of this disclosure are described in detail below with reference to the accompanying drawings.

BRIEF DESCRIPTION OF THE DRAWINGS

The accompanying drawings constitute part of the specification and illustrate various exemplary implementations of this application and, together with the specification, are used to explain the principles of this disclosure.

With reference to the accompanying drawings, this disclosure may be understood more clearly according to the following brief descriptions.

DETAILED DESCRIPTION

Exemplary implementations of this application are described in detail with reference to the accompanying drawings. It should be noted that relative arrangements of the components and steps, numerical expressions, and numerical values described in these implementations do not limit the scope of this application unless otherwise specifically described.

In the meanwhile, it should be understood that for ease of description, sizes of the parts shown in the accompanying drawings may not be drawn according to an actual proportional relationship.

The following descriptions of various implementations are only illustrative, and are not intended as any limitation to the scope, applications, or uses of this disclosure.

Technologies, methods, and devices that are known by a person of ordinary skill in the related art may not be discussed in detail. However, in proper cases, the technologies, methods, and devices should be considered as part of the granted specification.

In all examples shown and discussed herein, any specific value should be considered as only an example rather than as a limitation. Therefore, other examples of the exemplary implementations may have different values.

It should be noted that similar numerals, labels, and letters represent similar items in the following accompanying drawings. Therefore, once an item is defined in an accompanying drawing, the item does not need to be further discussed in the subsequent accompanying drawings.

To make the objectives, technical solutions, and advantages of this disclosure more clear, this disclosure is further described below in detail with reference to specific implementations and the accompanying drawings.

Figure 1:
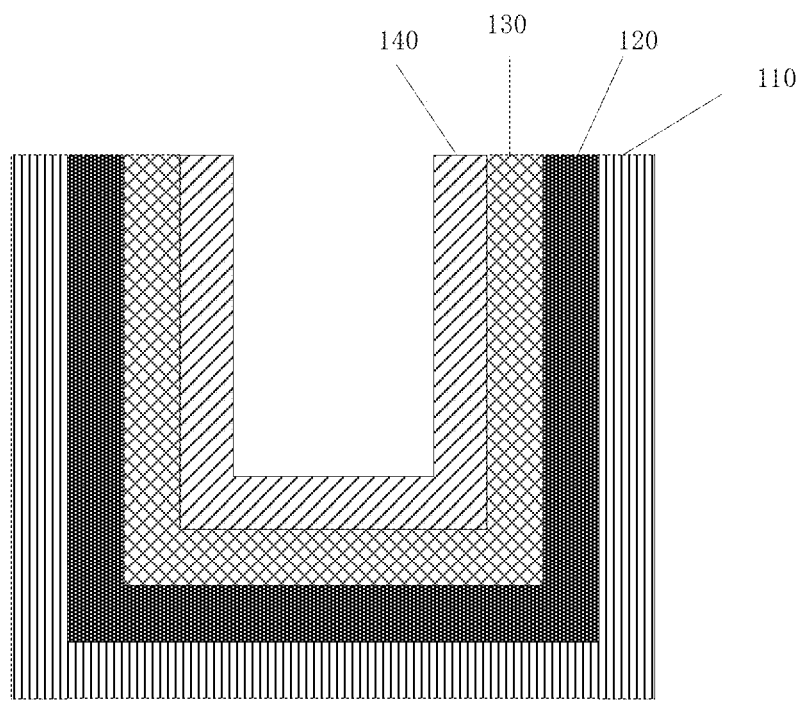
FIG. 1 is a schematic structural diagram of a gate of an HKMG FinFET in the related art.
Figure 2:
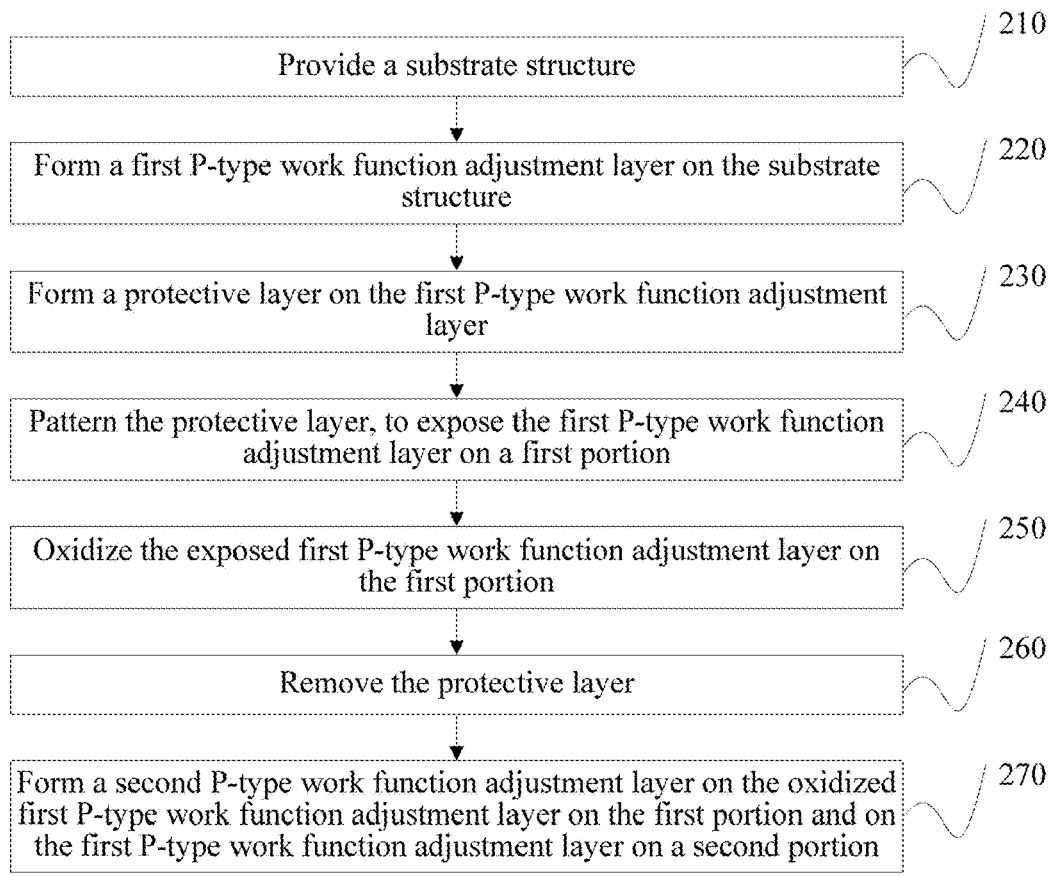
FIG. 2 is a logic flowchart of an implementation of a method for manufacturing a semiconductor structure.

FIG. 2 is a logic flowchart of an implementation of a method for manufacturing a semiconductor structure. The method includes the following steps.

Figure 3:
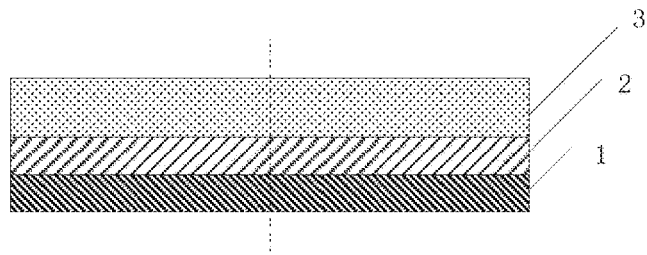
FIG. 3A-FIG. 3G are schematic structural diagrams at various phases in a process for manufacturing the semiconductor structure of FIG. 2.
Figure 3:
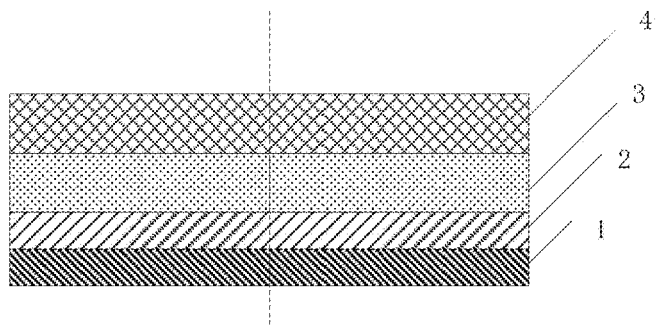
Figure 3:
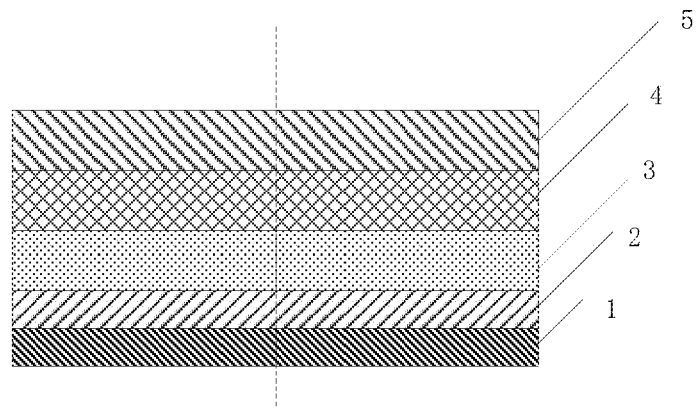
Figure 3:
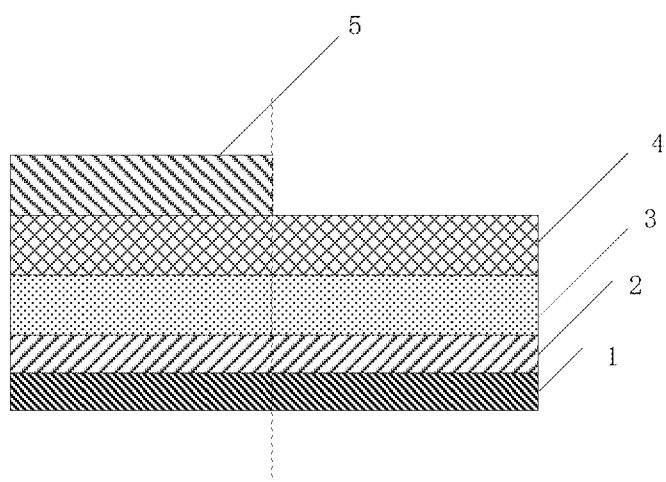
Figure 3:
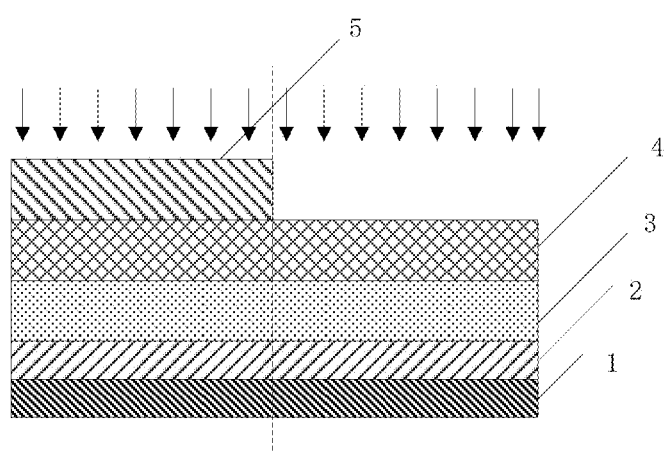
Figure 3:
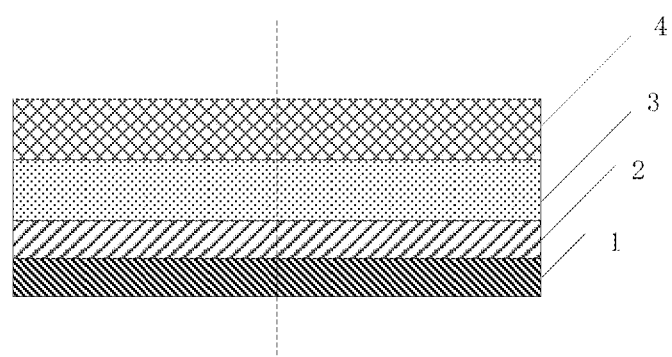
Figure 3:
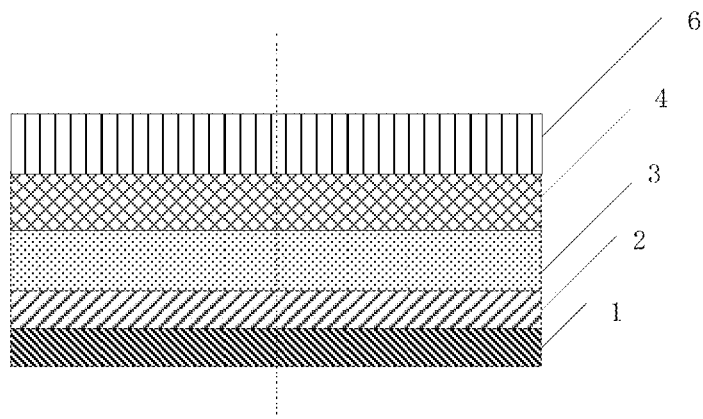

In Step 210, a substrate structure may be provided. The substrate structure may include a first portion for forming a first PMOS device and a second portion for forming a second PMOS device. As shown in FIG. 3A, the substrate structure to the right side of the dashed line provides the first portion, and the substrate structure to the left side of the dashed line provides the second portion. The substrate structure may include a substrate 1, an interface layer (IL) 2 on the substrate 1, and a high-dielectric-constant material layer 3 on the IL 2. The IL may be a silicon oxide layer.

In Step 220, a first P-type work function adjustment layer is formed on the substrate structure. Specifically as shown in FIG. 3B, a first P-type work function adjustment layer 4 is formed on the high-dielectric-constant material layer 3. A material for the first P-type work function adjustment layer may include one or more of Ta, TiN, TaN, TaSiN, and TiSiN. In some implementations, the first P-type work function adjustment layer may be a TiN layer or a cascading layer of the TiN layer and a TaN layer.

In Step 230, a protective layer is formed on the first P-type work function adjustment layer. First, as shown in FIG. 3C, a protective layer 5 may be formed on the first P-type work function adjustment layer 4. The protective layer may comprise an amorphous silicon (a-Si) layer. A material for the protective layer may alternatively comprise polysilicon, silicon nitride, or silicon oxide. Subsequently, a post cap annealing (PCA) processing is performed.

In Step 240, the protective layer may be patterned, to expose the first P-type work function adjustment layer on the first portion of the subtract structure. As shown in FIG. 3D, following this step, the protective layer 5 covers only the first P-type work function adjustment layer on the second portion.

In Step 250, the exposed first P-type work function adjustment layer on the first portion is oxidized. Details are shown in FIG. 3E. A flat band voltage (VFB) may be changed by adjusting an oxygen vacancy concentration at an interface between a metal and a high-k gate dielectric. For example, a higher oxygen vacancy concentration leads to a greater VFB, and consequently a lower voltage threshold of a PMOS. Because of the oxidization, an oxygen vacancy concentration at an interface of the high-dielectric-constant material layer that is on the first portion and that is adjacent to the first P-type work function adjustment layer is higher than an oxygen vacancy concentration at an interface of the high-dielectric-constant material layer adjacent to the first P-type work function adjustment layer on the second portion of the substrate structure.

In Step 260, the protective layer is removed. As shown in FIG. 3F, the protective layer 5 is removed.

In Step 270, a second P-type work function adjustment layer on the oxidized first P-type work function adjustment layer on the first portion, and on the first P-type work function adjustment layer on the second portion is formed. As shown in FIG. 3G, the second P-type work function adjustment layer 6 is formed on the first P-type work function adjustment layer 4. A material for the second P-type work function adjustment layer 6 may include one or more of Ta, TiN, TaN, TaSiN, and TiSiN. Preferably, the second P-type work function adjustment layer may include a TiN layer.

In the implementation above, during a process of manufacturing the semiconductor structure, because the first P-type work function adjustment layer on the first portion is oxidized, the oxygen vacancy concentration at the interface of the high-dielectric-constant material layer adjacent to the first P-type work function adjustment layer on the first portion is higher than the oxygen vacancy concentration at the interface of the high-dielectric-constant material layer adjacent to the first P-type work function adjustment layer on the second portion. The thickness of a metal layer on the first portion needed to achieve a particular gate threshold voltage is reduced, so that voltage thresholds of the first portion and the second portion are different when the thicknesses of metal layers on the first portion and the second portion are the same.

Figure 4:
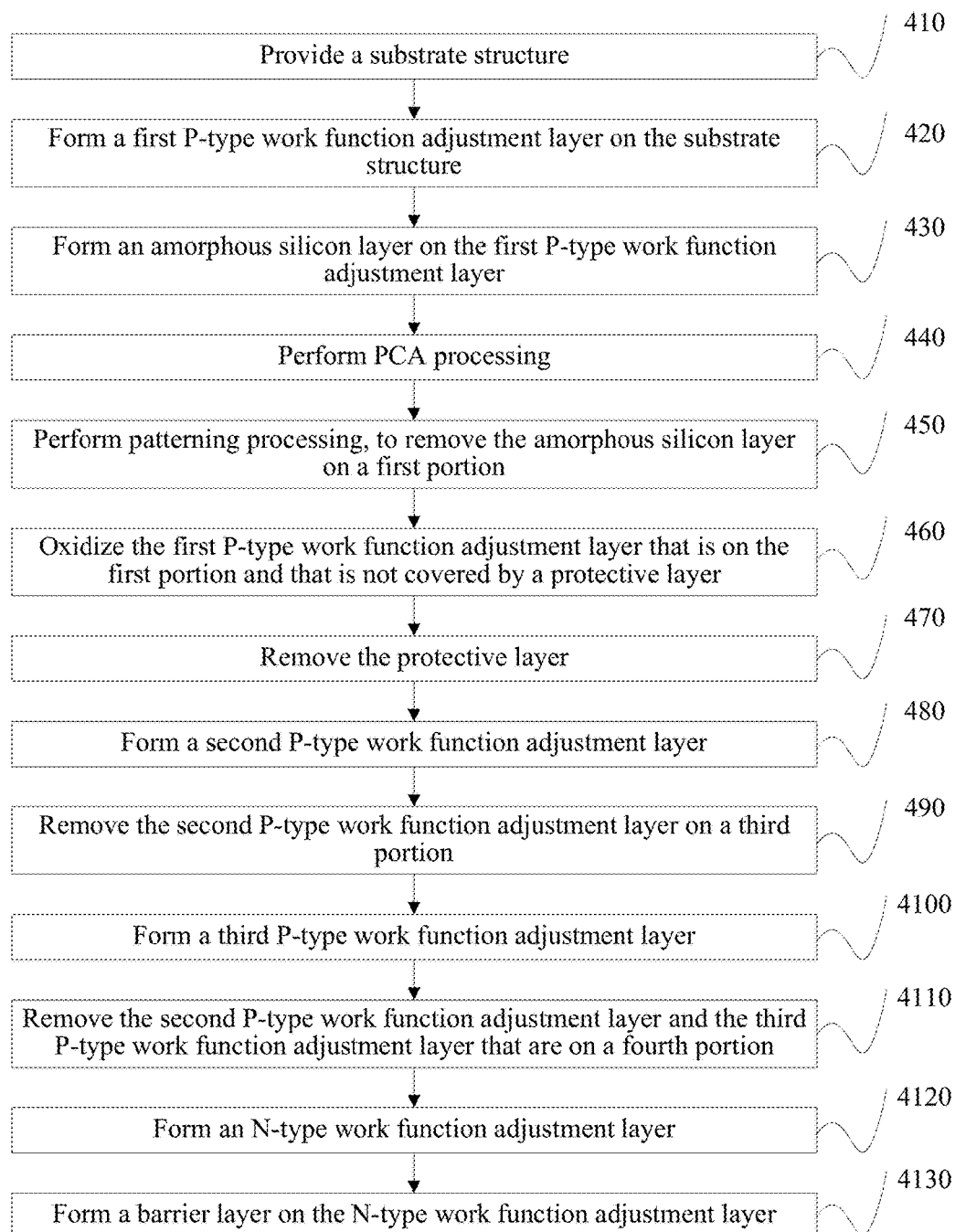
FIG. 4 is a logic flowchart of another implementation of a method for manufacturing another semiconductor structure.

FIG. 4 is a schematic flowchart of another implementation of a method for manufacturing a semiconductor structure. The semiconductor structure may include four semiconductor devices.

Figure 5:
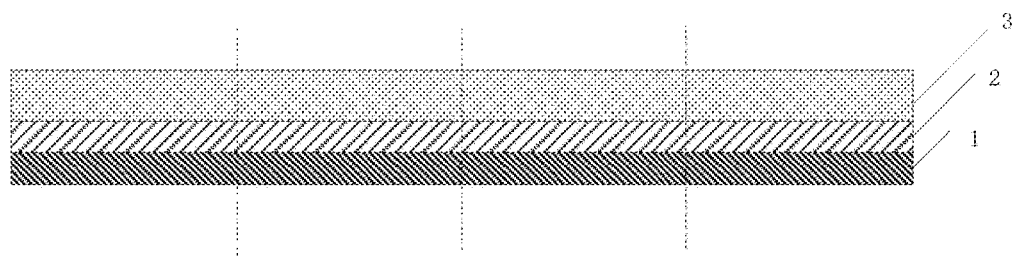
FIG. 5A-5L are schematic structural diagrams at various phases in a process of manufacturing the semiconductor structure of FIG. 4.
Figure 5:
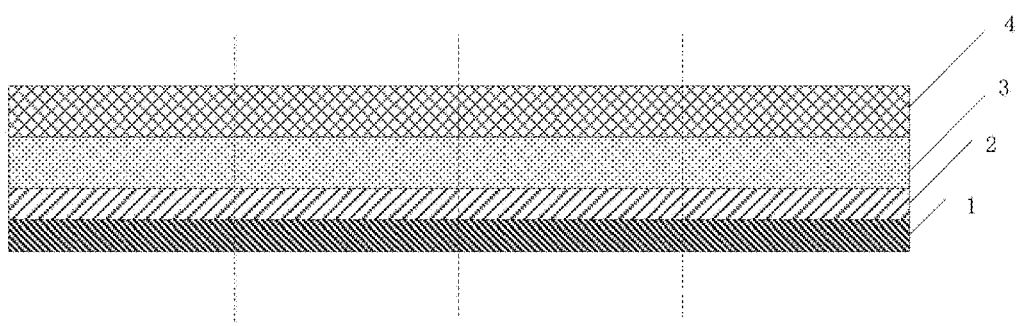
Figure 5:
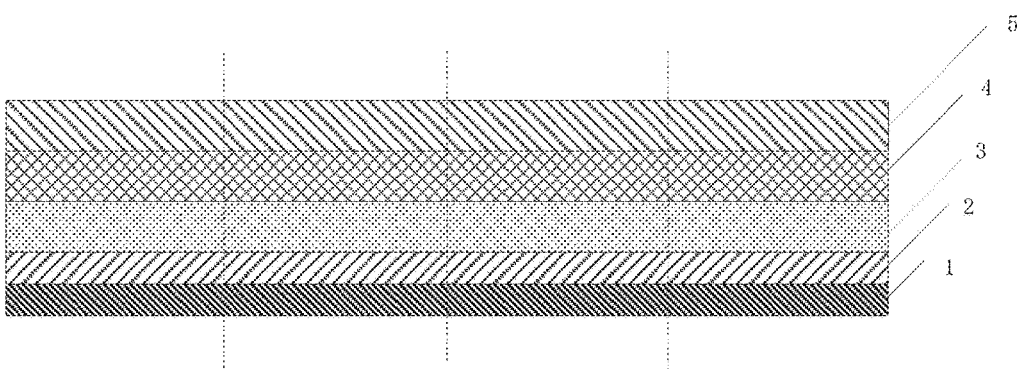
Figure 5:
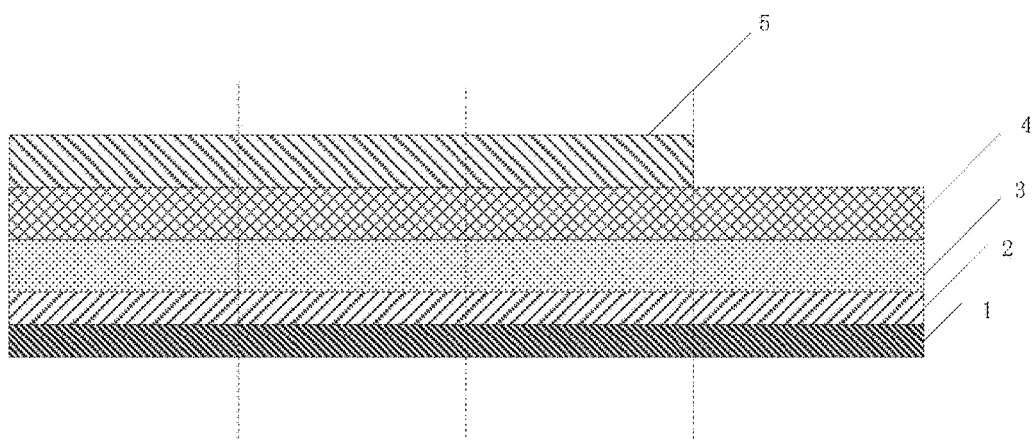
Figure 5:
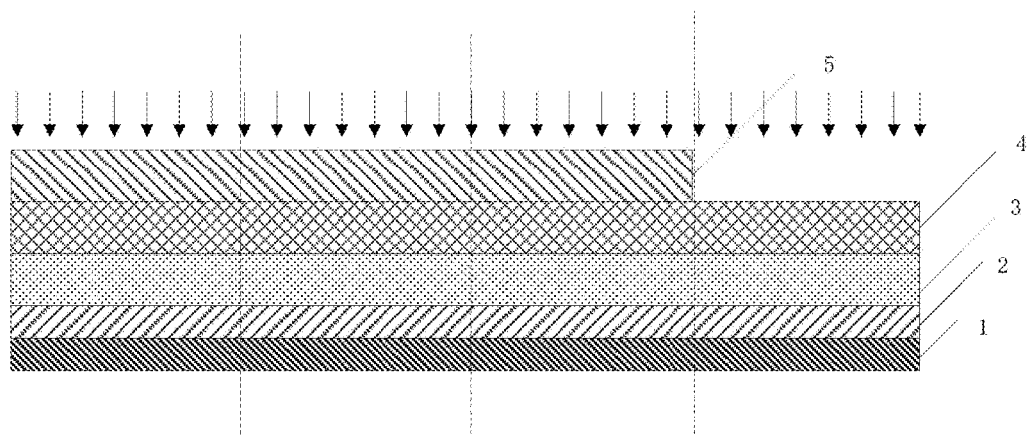
Figure 5:
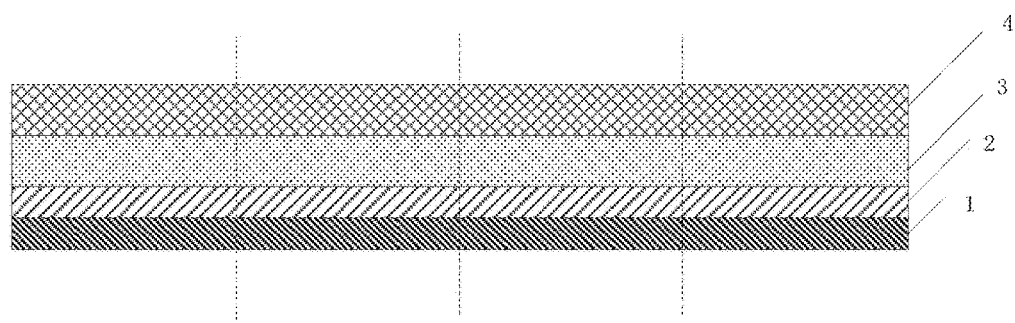
Figure 5:
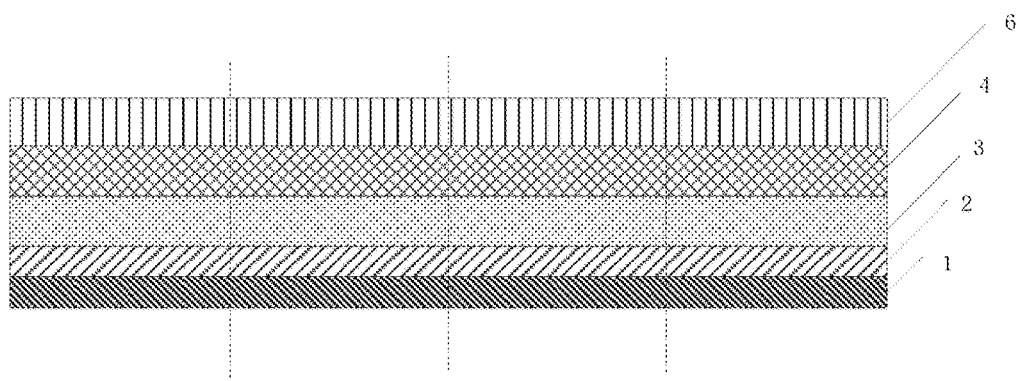
Figure 5:
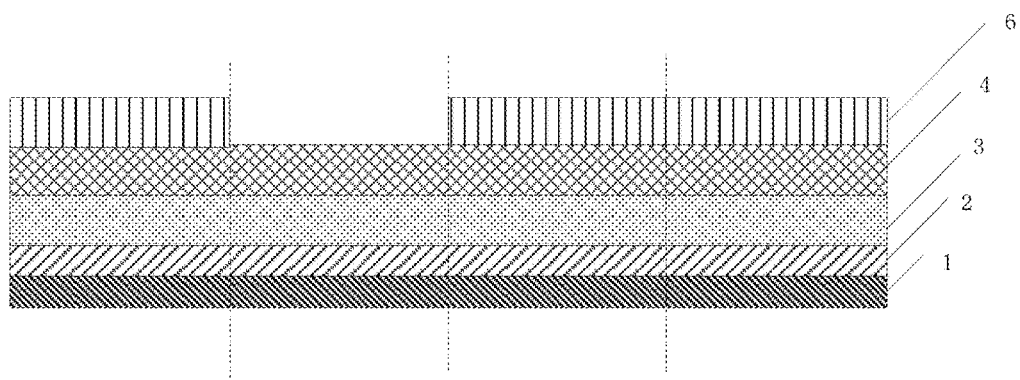
Figure 5:
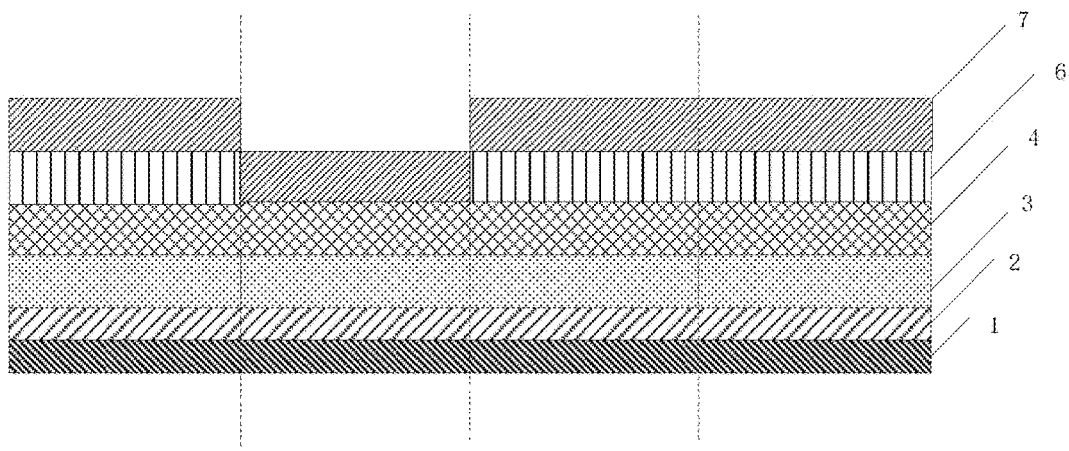
Figure 5:
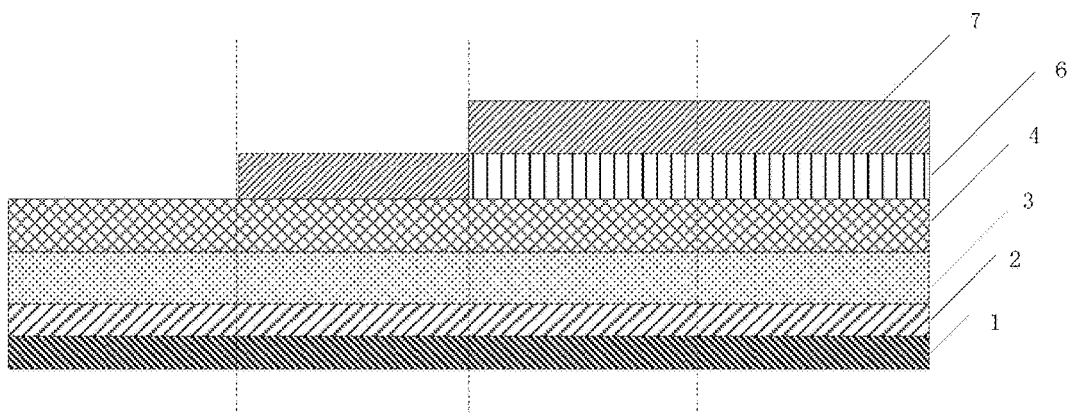
Figure 5:
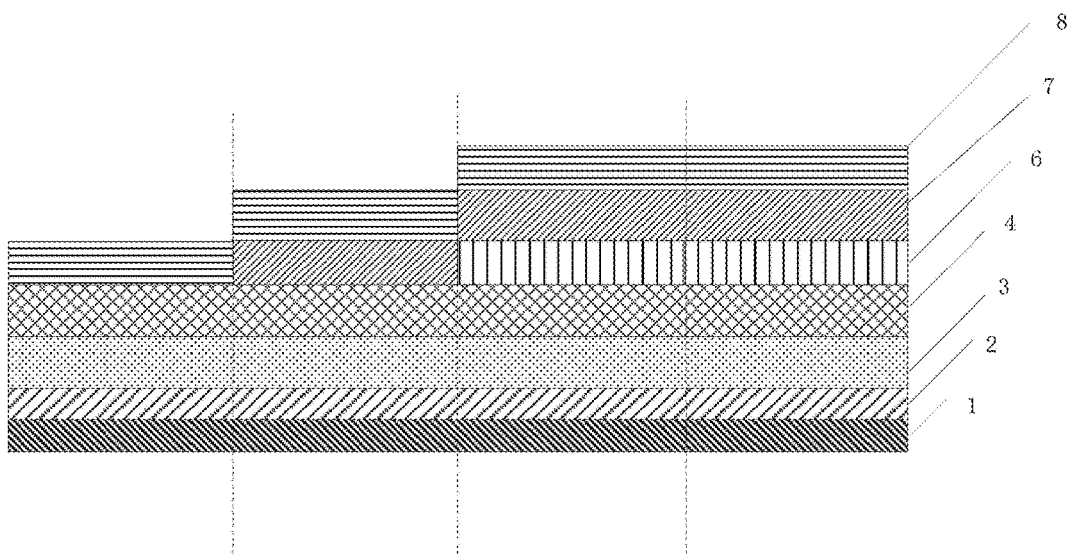
Figure 5:
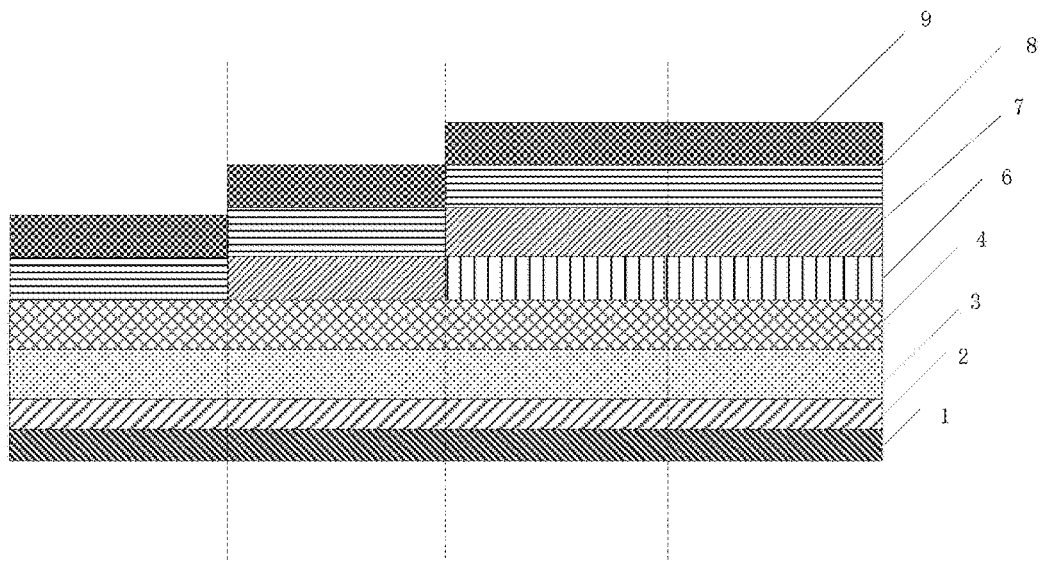

In Step 410, a substrate structure is provided. The substrate structure may include a first portion for forming a first PMOS device, a second portion for forming a second PMOS device, a third portion for forming a first NMOS device, and a fourth portion for forming a second NMOS device. FIG. 5A further illustrates the first portion, the second portion, the third portion, and the fourth portion from the right to the left using dashed lines as boundaries.

In Step 420, a first P-type work function adjustment layer is formed on the substrate structure. As shown in FIG. 5B, a first P-type work function adjustment layer 4 is formed on a high-dielectric-constant material layer 3.

In Step 430, an amorphous silicon layer is formed on the first P-type work function adjustment layer. As shown in FIG. 5C, an amorphous silicon layer 5 is formed on the first P-type work function adjustment layer 4.

In Step 440, PCA processing is performed.

In Step 450, patterning processing is performed to remove the amorphous silicon layer on the first portion. That is, as shown in FIG. 5D, after the patterning process, the amorphous silicon layer 5 covers only the second portion, the third portion, and the fourth portion.

In Step 460, oxidization is performed on the first P-type work function adjustment layer that is on the first portion and not covered by a protective layer, as shown in FIG. 5E.

In Step 470, the protective layer may be removed. As shown in FIG. 5F, the protective layer 5 is removed.

In Step 480, a second P-type work function adjustment layer is formed on the oxidized first P-type work function adjustment layer on the first portion, the first P-type work function adjustment layer on the second portion (non-oxidized), the first P-type work function adjustment layer on the third portion (non-oxidized), and the first P-type work function adjustment layer on the fourth portion (non-oxidized). As shown in FIG. 5G, a second P-type work function adjustment layer 6 is formed on the first P-type work function adjustment layer 4.

In Step 490, the second P-type work function adjustment layer on the third portion is removed. As shown in FIG. 5H, following this step, the second P-type work function adjustment layer 6 covers only the first portion, the second portion, and the fourth portion.

In Step 4100, a third P-type work function adjustment layer is formed on the second P-type work function adjustment layer on the first portion, the second portion, and the fourth portion, and on the first P-type work function adjustment layer on the third portion. As shown in FIG. 5I, a third P-type work function adjustment layer 7 is formed. A material for the third P-type work function adjustment layer may include one or more of Ta, TiN, TaN, TaSiN, and TiSiN. Preferably, the third P-type work function adjustment layer may include a TiN layer.

In Step 4110, the second P-type work function adjustment layer and the third P-type work function adjustment layer on the fourth portion may be removed, as shown in FIG. 5J.

This implementation above may further include Step 4120 for forming an N-type work function adjustment layer on the third P-type work function adjustment layer on the first portion, on the third P-type work function adjustment layer on the second portion, on the third P-type work function adjustment layer on the third portion, and on the first P-type work function adjustment layer on the fourth portion. As shown in FIG. 5K, an N-type work function adjustment layer 8 is formed on the third P-type work function adjustment layer 7 and first P-type work function adjustment layer 4. A material for the N-type work function adjustment layer may include one or more of TiAl, TiAlC, TaAlN, TiAlN, TaCN, and AlN. Preferably, the N-type work function adjustment layer may include a TiAl layer.

In Step 4130, a barrier layer is formed on the N-type work function adjustment layer. As shown in FIG. 5L, a barrier layer 9 is formed on the N-type work function adjustment layer 8.

In forms of the foregoing implementations, a voltage threshold of the first portion is less than a voltage threshold of the second portion when the thicknesses of metal layers on the first portion and the second portion are the same due to oxidation of the first portion. In addition, because work function layers on the first portion, the second portion, the third portion, and the fourth portion are different, the semiconductor structure may have four voltage thresholds. For example, the first portion may provide a P-type ultra-low voltage threshold (PULVT) or a P-type low voltage threshold (PLVT), the second portion may provide a P-type standard voltage threshold (PSVT) or a P-type high voltage threshold (PHVT), the third portion may provide an N-type standard voltage threshold (NSVT) or an N-type high voltage threshold (NHVT), and the fourth portion may provide an N-type ultra-low voltage threshold (NULVT) or an N-type low voltage threshold (NLVTN).

Figure 6:
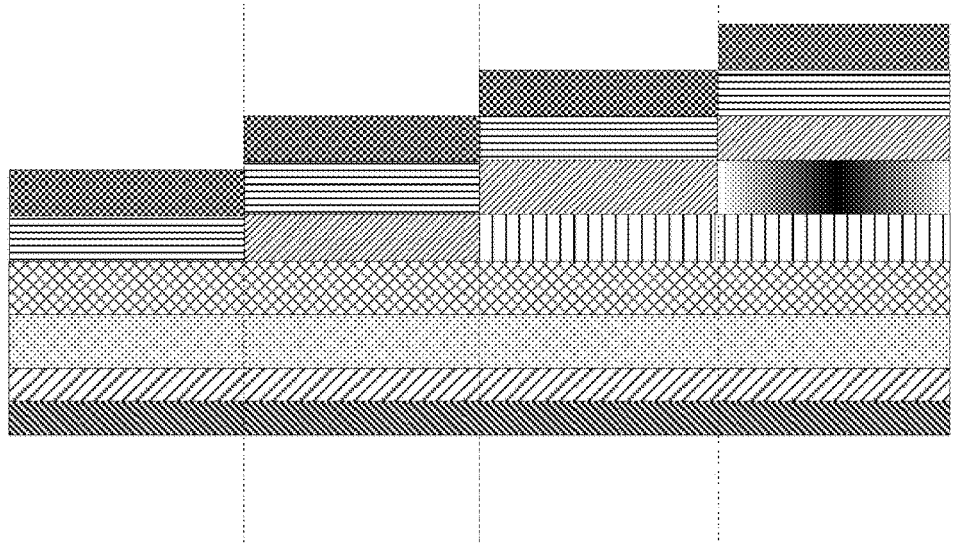
FIG. 6 is a schematic diagram of a semiconductor structure in the related art.

FIG. 6 shows a semiconductor structure including four semiconductor devices in the related art. To achieve different voltage thresholds in four different portions, four TiN layers are required on the first portion. However, as the thickness of a gate is reduced, the metal gate of the fourth portion is relatively too thick. However, in implementations of this disclosure, a fourth layer P-type work function adjustment layer may be omitted, reducing the thickness of the combined work function adjustment layers. Further, because the first P-type work function adjustment layer on the first portion is oxidized, the voltage threshold of the first portion is less than the voltage threshold of a second portion. In some implementations, an amorphous silicon layer may be used in PCA. For example, a PCA deposited amorphous silicon layer is used as a protective layer or a mask. Therefore, there may be no need to deposit another cap.

Figure 7:
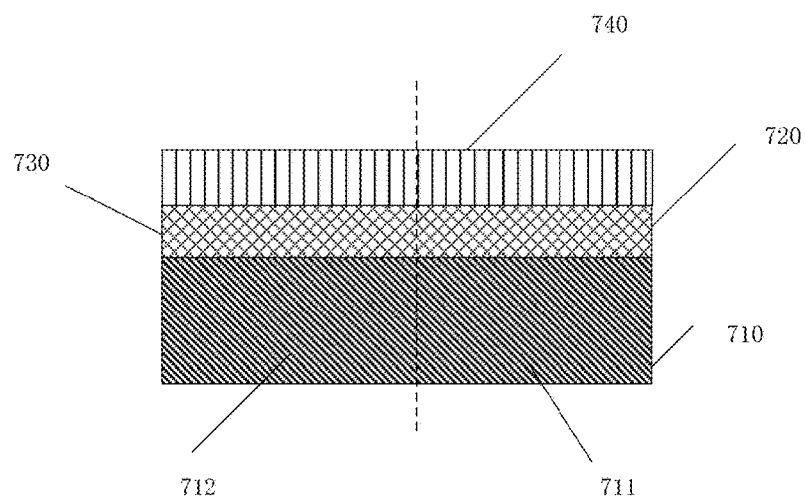
FIG. 7 is a schematic structural diagram of a semiconductor structure implemented in this disclosure.

FIG. 7 is a schematic structural diagram of a semiconductor structure according to one implementation.

The semiconductor structure of FIG. 7 includes a substrate structure 710, where the substrate structure 710 includes a first portion 711 for forming a first PMOS device and a second portion 712 for forming a second PMOS device. The right side of a dashed line corresponds to the first portion, and the left side of the dashed line corresponds to the second portion. The substrate structure 710 may include, as shown in FIG. 3A to FIG. 3G, a substrate 1, an IL 2 on the substrate 1, and a high-dielectric-constant material layer 3 on the IL 2. The IL may include a silicon oxide layer.

The semiconductor structure of FIG. 7 may further include a first P-type work function adjustment layer 720 on the first portion 711 and a first P-type work function adjustment layer 730 on the second portion 712, where an oxygen vacancy concentration at an interface of the high-dielectric-constant material layer adjacent to the first P-type work function adjustment layer 720 at on the first portion is higher than an oxygen vacancy concentration at an interface of the high-dielectric-constant material layer adjacent to the first P-type work function adjustment layer 730 on the second portion. A VFB may be changed by adjusting an oxygen vacancy concentration at an interface between a metal and a high-k gate dielectric. For example, a higher oxygen vacancy concentration leads to a greater VFB, so that a voltage threshold of a PMOS is lower. In addition, a material for the first P-type work function adjustment layer 720 on the first portion may be the same as that of the first P-type work function adjustment layer 730 on the second portion. For example, the material may include one or more of Ta, TiN, TaN, TaSiN, and TiSiN.

The semiconductor structure of FIG. 7 may further include a second P-type work function adjustment layer 740 disposed on the first P-type work function adjustment layer 720 on the first portion and disposed on the first P-type work function adjustment layer 730 on the second portion. A material for the second P-type work function adjustment layer 740 may also include one or more of Ta, TiN, TaN, TaSiN, and TiSiN.

In this implementation of the semiconductor structure in FIG. 7, the oxygen vacancy concentration at the interface of the high-dielectric-constant material layer adjacent to the first P-type work function adjustment layer on the first portion is higher than the oxygen vacancy concentration at the interface of the high-dielectric-constant material layer adjacent to the first P-type work function adjustment layer on the second portion. Therefore, voltage thresholds of the first portion and the second portion are different even when the thicknesses of metal layers are the same.

In some implementations, the first portion has a PULVT or a PLVT, and the second portion has a PSVT or a PHVT.

Figure 8:
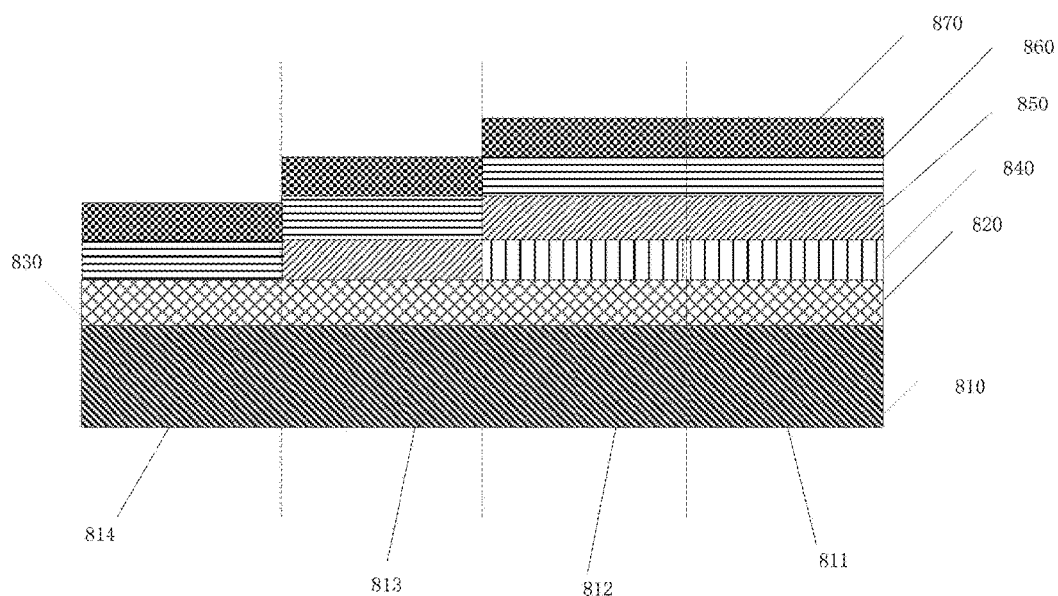
FIG. 8 is a schematic structural diagram of another semiconductor structure implemented in this disclosure.

FIG. 8 is a schematic structural diagram of another implementation of a semiconductor structure. The semiconductor structure may include four devices. The semiconductor structure may specifically include a substrate structure 810, where the substrate structure 810 includes: a first portion 811 for forming a first PMOS device, a second portion 812 for forming a second PMOS device, a third portion 813 for forming a first NMOS device, and a fourth portion 814 for forming a second NMOS device. For example, FIG. 8 illustrates the first portion 811, the second portion 812, the third portion 813, and the fourth portion 814 from the right to the left with three dashed lines being boundaries between the portions.

The semiconductor structure may further include a first P-type work function adjustment layer 820 on the first portion 811 and a first P-type work function adjustment layer 830 on the second portion 812, the third portion 813, and the fourth portion 814, where an oxygen vacancy concentration at an interface of a high-dielectric-constant material layer adjacent to the first P-type work function adjustment layer 820 on the first portion is higher than an oxygen vacancy concentration at an interface of the high-dielectric-constant material layer adjacent to the first P-type work function adjustment layer 830 on the second portion, the third portion, and the fourth portion.

The semiconductor structure may further include a second P-type work function adjustment layer 840 that is on the first P-type work function adjustment layer 820 on the first portion and that is on the first P-type work function adjustment layer 830 on the second portion.

The semiconductor structure may further include a third P-type work function adjustment layer 850 that is on the second P-type work function adjustment layer 840 and that is on the first P-type work function adjustment layer 830 on the third portion, where a material for the third P-type work function adjustment layer 850 may include one or more of Ta, TiN, TaN, TaSiN, and TiSiN.

Further, the semiconductor structure may further include an N-type work function adjustment layer 860 on the third P-type work function adjustment layer 850 and a barrier layer 870 on the N-type work function adjustment layer 860. A material for the N-type work function adjustment layer may include one or more of TiAl, TiAlC, TaAlN, TiAlN, TaCN, and AlN.

According to the foregoing implementation, a voltage threshold of the first portion is less than a voltage threshold of the second portion even when the thicknesses of metal layers are the same. In addition, because work function layers on the first portion, the second portion, the third portion, and the fourth portion are different, the semiconductor structure may have four voltage thresholds. For example, the first portion has a PULVT or a PLVT, the second portion has a PSVT or a PHVT, the third portion has an NSVT or an NHVT, and the fourth portion has an NULVT or an NLVTN. In addition, compared with the related art, a fourth layer P-type work function adjustment layer on the first portion may be omitted in this implementation. As such, the combination of the work function adjustment layers is thinner. Because the first P-type work function adjustment layer on the first portion is oxidized, the voltage threshold of the first portion is also less than the voltage threshold of the second portion. In some implementations, an amorphous silicon layer may be used in PCA. For example, a PCA deposited amorphous silicon layer may be used as a protective layer or a mask. Therefore, there may be no need to deposit another cap.

The foregoing semiconductor structure may be a part of an HKMG FinFET, or may be a part of a transistor having a planar structure.

In some implementations, if an HKMG FinFET includes the foregoing semiconductor structure, a thinner TiN layer (work function adjustment layers) can be used, thereby achieving multiple voltage thresholds.

Heretofore, this application is described in detail. To avoid obscuring the principles of this application, some details generally known in the art are not described. According to the foregoing descriptions, a person of ordinary skill in the art would understand how to implement the technical solutions disclosed herein.

The method and apparatus of this application may be implemented in multiple manners. For example, the method and apparatus of this application may be implemented by using software, hardware, firmware, or a combination thereof. The foregoing sequence of the steps of the method is merely exemplary. The steps of the methods above are not limited to the specific described order, unless otherwise particularly stated. In addition, in some implementations, the methods above may be implemented as programs that are recorded in a recording medium. These programs include machine readable instructions that are used to implement these methods. As such, this application further covers the recording medium that stores the programs used for implementing the methods above.

Some specific implementations of this disclosure are described in detail by using various examples. These examples do not limit the scope of this disclosure. A person of ordinary skill in the art should understand that the foregoing implementations may be modified without departing from the scope and spirit of this disclosure as defined by the appended claims.

What is claimed is:

1. A method for manufacturing a semiconductor structure, comprising:
   providing a substrate structure comprising a first portion for forming a first PMOS device and a second portion for forming a second PMOS device;
   forming a first P-type work function adjustment layer on the substrate structure;
   forming a protective layer on the first P-type work function adjustment layer;
   patterning the protective layer to expose the first P-type work function adjustment layer on the first portion;
   oxidizing the exposed first P-type work function adjustment layer on the first portion;
   removing the protective layer; and
   forming a second P-type work function adjustment layer on the first P-type work function adjustment layer.

2. The manufacturing method according to claim 1, wherein the substrate structure further comprises a third portion for forming a first NMOS device and a fourth portion for forming a second NMOS device, wherein the third portion and the fourth portion are covered sequentially by the same first P-type work function adjustment layer and the same second P-type work function adjustment layer as the first portion, and wherein the manufacturing method further comprises:
   removing the second P-type work function adjustment layer on the third portion;
   forming a third P-type work function adjustment layer on the second P-type work function adjustment layer of the first portion, second portion, and fourth portion, and on the first P-type work function adjustment layer of the third portion; and
   removing the second P-type work function adjustment layer and the third P-type work function adjustment layer from the fourth portion.

3. The manufacturing method according to claim 2, further comprising:
   forming an N-type work function adjustment layer on the third P-type work function adjustment layer of the first portion, the second portion, and the third portion, and on the first P-type work function adjustment layer over the fourth portion.

4. The manufacturing method according to claim 3, further comprising:
   forming a barrier layer on the N-type work function adjustment layer over all portions.

5. The manufacturing method according to claim 3, wherein the N-type work function adjustment layer comprises at least one of TiAl, TiAlC, TaAlN, TiAlN, TaCN, or AlN.

6. The manufacturing method according to claim 2, wherein:
   the first P-type work function adjustment layer, the second P-type work function adjustment layer, and the third P-type work function adjustment layer each comprise at least one of Ta, TiN, TaN, TaSiN, or TiSiN; and
   the protective layer comprises at least one of amorphous silicon, polysilicon, silicon nitride, or silicon oxide.

7. The manufacturing method according to claim 1, wherein the method further comprises performing an annealing processing before patterning the protective layer.

8. The manufacturing method according to claim 1, wherein the substrate structure comprises:
   an interface layer on a substrate; and
   a high-dielectric-constant material layer on the interface layer.

* * * * *